US009793184B2

(12) United States Patent
Riegler et al.

(10) Patent No.: US 9,793,184 B2
(45) Date of Patent: Oct. 17, 2017

(54) SENSOR FOR A SEMICONDUCTOR DEVICE (71) Applicant: Infineon Technologies AG, Neubiberg (DE)

(72) Inventors: Andreas Riegler, Lichtpold (AT); Angelika Koprowski, Klagenfurt (AT); Mathias Plappert, Villach (AT); Frank Wolter, Munich (DE)

(73) Assignee: Infineon Technologies AG, Neubiberg (DE)

( * ) Notice: Subject to any disclaimer, the term of this patent is extended or adjusted under 35 U.S.C. 154(b) by 37 days.

(21) Appl. No.: 15/062,828

(22) Filed: Mar. 7, 2016

(65) Prior Publication Data

US 2016/0268177 A1 Sep. 15, 2016

(30) Foreign Application Priority Data

Mar. 11, 2015 (DE) .................. 10 2015 204 315

(51) Int. Cl.
*H01L 29/78* (2006.01)
*H01L 21/66* (2006.01)
(Continued)

(52) U.S. Cl.
CPC .............. *H01L 22/30* (2013.01); *H01L 22/20* (2013.01); *H01L 29/7393* (2013.01);
(Continued)

(58) Field of Classification Search
CPC ..... H01L 22/30; H01L 22/20; H01L 29/7801; H01L 29/7393; H01L 29/861
See application file for complete search history.

(56) References Cited

U.S. PATENT DOCUMENTS

2003/0141522 A1  7/2003  Yedinak et al.
2012/0133388 A1  5/2012  Bernoux et al.
(Continued)

FOREIGN PATENT DOCUMENTS

DE         199 18 028 A1    2/2000
DE    11 2004 002 608 T5    11/2006

OTHER PUBLICATIONS

Office Action Communication of the German Patent and Trademark Office for File Reference 102015204315.0 dated Jan. 21, 2016.

*Primary Examiner* — Mark Prenty
(74) *Attorney, Agent, or Firm* — Baker Botts L.L.P.

(57) ABSTRACT

A semiconductor arrangement is presented. The semiconductor arrangement comprises a semiconductor body, the semiconductor body including a semiconductor drift region, wherein the semiconductor drift region has dopants of a first conductivity type; a first semiconductor sense region and a second semiconductor sense region, wherein each of the first semiconductor sense region and the second semiconductor sense region is electrically connected to the semiconductor drift region and has dopants of a second conductivity type different from said first conductivity type; a first metal contact comprising a first metal material, the first metal contact being in contact with the first semiconductor sense region, wherein a transition between the first metal contact and the first semiconductor sense region forms a first metal-to-semiconductor transition; a second metal contact comprising a second metal material different from said first metal material, the second metal contact being separated from the first metal contact and in contact with the second semiconductor sense region, a transition between the second metal contact and the second semiconductor sense region forming a second metal-to-semiconductor transition different from said first metal-to-semiconductor transition; first electrical transmission means, the first electrical transmission means
(Continued)

being arranged and configured for providing a first sense signal derived from an electrical parameter of the first metal contact to a first signal input of a sense signal processing unit; and second electrical transmission means separated from said first electrical transmission means, the second electrical transmission means being arranged and configured for providing a second sense signal derived from an electrical parameter of the second metal contact to a second signal input of said sense signal processing unit.

20 Claims, 5 Drawing Sheets (51) Int. Cl.
*H01L 29/739* (2006.01)
*H01L 29/45* (2006.01)
*H01L 29/47* (2006.01)
(52) U.S. Cl.
CPC ........ *H01L 29/7801* (2013.01); *H01L 29/456* (2013.01); *H01L 29/47* (2013.01)

(56) References Cited

U.S. PATENT DOCUMENTS

2014/0225114 A1    8/2014   Furukawa et al.
2016/0268177 A1*   9/2016   Riegler .................. H01L 22/30

\* cited by examiner

SENSOR FOR A SEMICONDUCTOR DEVICE

CROSS-REFERENCE TO RELATED APPLICATION

This application claims priority to German Application Serial No. 102015204315.0 filed Mar. 11, 2015 and entitled "Sensor for a Semiconductor Device".

TECHNICAL FIELD

This specification refers to embodiments of a semiconductor arrangement and to embodiments of a method for determining a physical parameter of a semiconductor device. In particular, this specification refers to embodiments of semiconductor arrangements comprising means for sensing a physical parameter of a semiconductor device.

BACKGROUND

Many functions of modern devices in automotive, consumer and industrial applications, such as converting electrical energy and driving an electric motor or an electric machine, rely on semiconductor devices. For example Insulated Gate Bipolar Transistors (IGBTs), Metal Oxide Semiconductor Field Effect Transistors (MOSFETs) and diodes have been used for various applications including, but not limited to switches in power supplies and power converters.

Occasionally, a semiconductor arrangement comprises means for carrying out a protective function, such as a short circuit turn-off function. To this end, a semiconductor device of the semiconductor arrangement may be electrically coupled to a control circuit that controls operation of the semiconductor device in dependence of a semiconductor device temperature and/or in dependence of a semiconductor device load current that flows through the semiconductor device. For example, if the semiconductor device temperature and/or the semiconductor device load current exceeds a respective threshold value, the control circuit may react by turning off the semiconductor device, which causes the load current to be reduced to approximately zero.

SUMMARY

According to an embodiment, a semiconductor arrangement is presented. The semiconductor arrangement comprises: a semiconductor body, the semiconductor body including a semiconductor drift region, wherein the semiconductor drift region has dopants of a first conductivity type; a first semiconductor sense region and a second semiconductor sense region, wherein each of the first semiconductor sense region and the second semiconductor sense region is electrically connected to the semiconductor drift region and has dopants of a second conductivity type different from said first conductivity type; a first metal contact comprising a first metal material, the first metal contact being in contact with the first semiconductor sense region, wherein a transition between the first metal contact and the first semiconductor sense region forms a first metal-to-semiconductor transition; a second metal contact comprising a second metal material different from said first metal material, the second metal contact being separated from the first metal contact and in contact with the second semiconductor sense region, a transition between the second metal contact and the second semiconductor sense region forming a second metal-to-semiconductor transition different from said first metal-to-semiconductor transition; first electrical transmission means, the first electrical transmission means being arranged and configured for providing a first sense signal derived from an electrical parameter of the first metal contact to a first signal input of a sense signal processing unit, and second electrical transmission means separated from said first electrical transmission means, the second electrical transmission means being arranged and configured for providing a second sense signal derived from an electrical parameter of the second metal contact to a second signal input of said sense signal processing unit.

According to a further embodiment, a further semiconductor arrangement is presented. The further semiconductor arrangement comprises: a semiconductor body, the semiconductor body including a semiconductor drift region, wherein the semiconductor drift region has dopants of a first conductivity type; a first load contact electrically coupled to the semiconductor body and a second load contact electrically coupled to the semiconductor body, the semiconductor drift region being arranged for conducting a load current between the first load contact and the second load contact in an active region of the semiconductor body; a plurality of semiconductor drain regions arranged at least partially internal of the semiconductor body between said active region of the semiconductor body and a non-active region of the semiconductor body, wherein each of the plurality of semiconductor drain regions is in contact with the semiconductor drift region and has dopants of a second conductivity type different from said first conductivity type, and wherein the plurality of semiconductor drain regions comprises a first semiconductor drain region acting as a first semiconductor sense region, a second semiconductor drain region acting as a second semiconductor sense region, and a third semiconductor drain region, the third semiconductor drain region being electrically connected to the first load contact and being configured for draining charge carriers from the semiconductor drift region; a first metal contact comprising a first metal material, the first metal contact being separated from the first load contact and the second load contact and in contact with the first semiconductor sense region, wherein a transition between the first metal contact and the first semiconductor sense region forms a first metal-to-semiconductor transition; a second metal contact comprising a second metal material different from said first metal material, the second metal contact being separated from the first load contact, the second load contact, and the first metal contact, and being in contact with the second semiconductor sense region, a transition between the second metal contact and the second semiconductor sense region forming a second metal-to-semiconductor transition different from said first metal-to-semiconductor transition.

According to yet a further embodiment, a method for determining a physical parameter of a semiconductor device is presented, wherein the semiconductor device comprises: a semiconductor body, the semiconductor body including a semiconductor drift region, wherein the semiconductor drift region has dopants of a first conductivity type; a first semiconductor sense region and a second semiconductor sense region, wherein each of the first semiconductor sense region and the second semiconductor sense region is electrically connected to the semiconductor drift region and has dopants of a second conductivity type different from said first conductivity type; a first metal contact comprising a first metal material, the first metal contact being in contact with the first semiconductor sense region, wherein a transition between the first metal contact and the first semiconductor sense region forms a first metal-to-semiconductor transition; a second metal contact comprising a second metal material different from said first metal material, the second metal contact being separated from the first metal contact and in contact with second semiconductor sense region, a transition between the second metal contact and the second semiconductor sense region forming a second metal-to-semiconductor transition different from said first metal-to-semiconductor transition. The method comprises: deriving a first sense signal from an electrical parameter of the first metal contact, wherein the electrical parameter of the first metal contact comprises at least one of an electrical potential of the first metal contact and a current through the first metal contact; deriving a second sense signal from an electrical parameter of the second metal contact, wherein the electrical parameter of the second metal contact comprises at least one of an electrical potential of the second metal contact and a current through the second metal contact; determining a value of said physical parameter of the semiconductor device in dependence of the first sense signal and the second sense signal, said value being indicative for at least one of a temperature of the semiconductor body and a load current conducted by the semiconductor body.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor region. This can be for instance the surface of a wafer or a die.

The term "vertical" as used in this specification intends to describe an orientation which is substantially arranged perpendicular to the horizontal surface, i.e., parallel to the normal direction of the surface of the semiconductor substrate or semiconductor region.

In this specification, n-doped may be referred to as "first conductivity type" while p-doped may be referred to as "second conductivity type". Alternatively, opposite doping relations can be employed so that the first conductivity type can be p-doped and the second conductivity type can be n-doped. For example, an n-doped semiconductor region can be produced by inserting donors into a semiconductor region. Further, a p-doped semiconductor region can be produced by inserting acceptors into a semiconductor region.

In the context of the present specification, the terms "in ohmic contact", "in electric contact", "in ohmic connection", and "electrically connected" intend to describe that there is a low ohmic electric connection or low ohmic current path between two regions, sections, portions or parts of a semiconductor arrangement or between different terminals of one or more devices or between a terminal or a metallization or an electrode and a portion or part of a semiconductor arrangement. Further, in the context of the present specification, the term "in contact" intends to describe that there is a direct physical connection between two elements of the respective semiconductor arrangement; e.g., a transition between two elements being in contact with each other may not include a further intermediate element or the like.

Specific embodiments described in this specification pertain to, without being limited thereto, monolithically integrated semiconductor arrangements having an IGBT, MOSFET or diode structure, in particular to bipolar power semiconductor arrangements, such as IGBTs.

The term "power semiconductor device" as used in this specification intends to describe a semiconductor device on a single chip with high voltage blocking and/or high current-carrying capabilities. Such semiconductor device may be part of a semiconductor arrangement. In other words, said power semiconductor devices are intended for high current, such as in the Ampere range, e.g., up to several hundred Ampere, and/or high voltages, such as above 40 V, 100 V and above.

Figure 1:
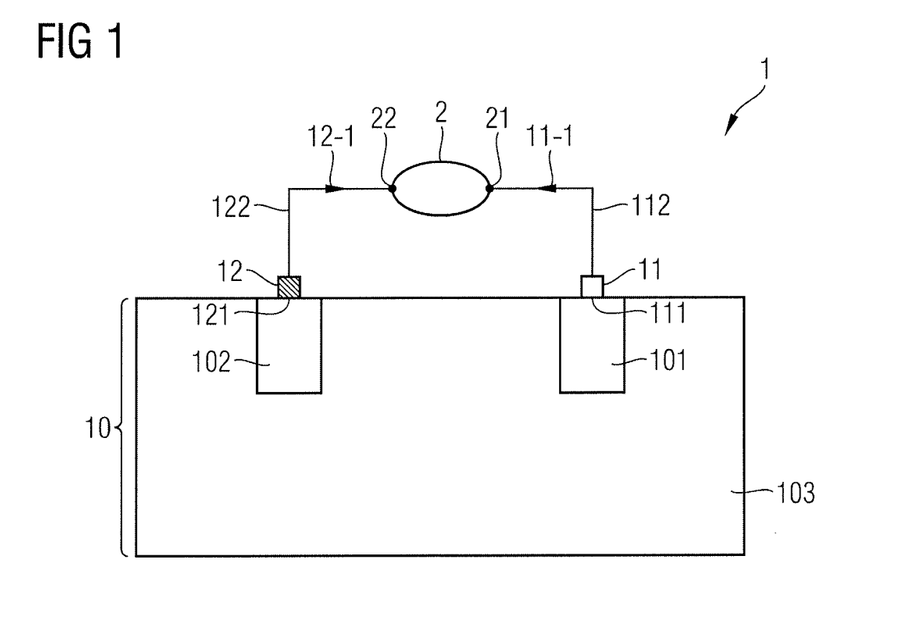
FIG. 1 schematically illustrates a section of a vertical cross-section of a semiconductor arrangement according to one or more embodiments.

FIG. 1 schematically illustrates a section of a vertical cross-section of a semiconductor arrangement 1 according to one or more embodiments. The semiconductor arrangement 1 comprises a semiconductor body 10, which may, e.g., comprise silicon.

The semiconductor body 10 includes a semiconductor drift region 103. For example, at least a part of the semiconductor body 10 can be configured for forming a semiconductor drift region 103 of a semiconductor device such as an IGBT or a MOSFET. Or, at least a part of said semiconductor body 10 can, for instance, be configured for forming a semiconductor drift region 103 of a diode, such as a p-i-n diode.

The term "semiconductor drift region", as used in this specification in connection with said semiconductor body 10, is not necessarily limited to regions that are arranged and configured to conduct a charge carrier current in an active area of the semiconductor body 10, but may also be directed to extensions of such regions into non-active areas, e.g., close to edges of the semiconductor body 10. An example of a semiconductor arrangement 1 with a semiconductor body 10 having an active area and a non-active area will be explained in more detail below in connection with the embodiments of FIG. 2 and FIG. 3.

The semiconductor drift region 103 has dopants of a first conductivity type, which can be, for example, n-type in the case of an $n^-$-doped semiconductor drift region 103.

The semiconductor arrangement 1 further comprises a first semiconductor sense region 101 and a second semiconductor sense region 102, wherein each of the first semiconductor sense region 101 and the second semiconductor sense region 102 is electrically connected to the semiconductor drift region 103 and has dopants of a second conductivity type different from said first conductivity type. For example, the first semiconductor sense region 101 and the second semiconductor sense region 102 may comprise p-doped semiconductor regions which are electrically connected to an n-doped part of the semiconductor drift region 103, or vice versa.

In accordance with the embodiment illustrated in FIG. 1, each of the first semiconductor sense region 101 and the second semiconductor sense region 102 may be arranged at least partially internal of the semiconductor body 10 and may be in contact with the semiconductor drift region 103. For example, each of the first semiconductor sense region 101 and the second semiconductor sense region 102 may comprise a p-well region that has been created, e.g., by diffusion or implantation of p-dopants into an n-doped semiconductor body 10 from a surface of said semiconductor body 10.

In an embodiment, the second semiconductor sense region 102 is separated from the first semiconductor sense region 101. For example, in accordance with the embodiment illustrated in FIG. 1, the second semiconductor sense region 102 is separated from the first semiconductor sense region 101 by portions of the semiconductor drift region 103. In another embodiment, the second semiconductor sense region 102 may be in contact with the first semiconductor sense region 101 (not depicted).

Further, the semiconductor arrangement 1 comprises a first metal contact 11. The first metal contact 11 includes a first metal material and is in contact with the first semiconductor sense region 101. A transition between the first metal contact 11 and the first semiconductor sense region 101 forms a first metal-to-semiconductor transition 111. The first metal-to-semiconductor transition 111 may establish an ohmic contact between the first semiconductor sense region 101 and the first metal contact 11. Depending on a work function of said first metal material and a dopant concentration of said first semiconductor sense region 101, the first metal-to-semiconductor transition 111 may also establish a Schottky contact between the first semiconductor sense region 101 and the first metal contact 11. For example, the first semiconductor sense region 101 comprises p-doped silicon. The first metal material may comprise, for instance, at least one of aluminum silicon copper or tungsten titanium.

In addition to said first metal contact 11, the semiconductor arrangement 1 comprises a second metal contact 12, which comprises a second metal material that is different from said first metal material. For example, the first metal material comprises aluminum silicon copper, and the second metal material comprises tungsten titanium, or vice versa. The second metal contact 12 is separated from the first metal contact 11 and is in contact with the second semiconductor sense region 102. Thus, a transition between the second metal contact 12 and the second semiconductor sense region 102 forms a second metal-to-semiconductor transition 121 different from said first metal-to-semiconductor transition 111. In analogy with what has been stated above about the first metal-to-semiconductor transition 111, also the second metal-to-semiconductor transition 121 may establish an ohmic contact or a Schottky contact between said second semiconductor sense region 102 and said first metal contact 12.

In an embodiment, said second metal-to-semiconductor transition 121 differs from said first metal-to-semiconductor transition 111 in that a resistance of the first metal-to-semiconductor transition 111 has a temperature dependency that is different from a temperature dependency of a resistance of the second metal-to-semiconductor transition 121.

For example, the first metal-to-semiconductor transition 111 and the second metal-to-semiconductor transition 121 each establish an ohmic contact between, on the one hand, the first or respectively, the second semiconductor sense region 101/102 and, on the other hand, the first or, respectively, the second metal contact 11/12, wherein a temperature dependency of an ohmic resistance at the second metal-to-semiconductor transition 121 may be different from a temperature dependency of an ohmic resistance at the first metal-to-semiconductor transition 111.

In a further embodiment, the first metal-to-semiconductor transition 111 and the second metal-to-semiconductor transition 121 may each establish a Schottky contact between, on the one hand, the first or respectively, the second semiconductor sense region 101/102 and, on the other hand, the first or, respectively, the second metal contact 11/12, wherein a temperature dependency of a forward voltage drop (and correspondingly of a resistance) at the second metal-to-semiconductor transition 121 may be different from a temperature dependency of a forward voltage drop (and correspondingly of a resistance) at the first metal-to-semiconductor transition 111. For example, the difference in the forward voltage drops of said Schottky contacts at the first and second metal-to-semiconductor transitions 111 and 121 may be related to the first and second metal materials having different work functions.

The semiconductor arrangement 1 further comprises first electrical transmission means 112 that are arranged and configured for providing a first sense signal 11-1 derived from an electrical parameter of the first metal contact 11 to a first signal input 21 of a sense signal processing unit 2. In addition to said first electrical transmission means, the semiconductor arrangement 1 comprises second electrical transmission means 122 separated from said first electrical transmission means 112. The second electrical transmission means 122 are arranged and configured for providing a second sense signal 12-1 derived from an electrical parameter of the second metal contact 12 to a second signal input 22 of said sense signal processing unit 2.

For example, said first and second electrical transmission means 112, 122 comprise a first metal pad 18-1 (see FIG. 4), a second metal pad 18-2, and a metallic circuit arrangement arranged on top of the semiconductor body 10, wherein the metallic circuit arrangement is configured for transmitting said first and second sense signals 11-1, 12-1 to said first metal pad 18-1 and to said second metal pad 18-2, respectively. Said metal circuit arrangement may comprise a structured metallization layer arranged on a surface of said semiconductor body 10. The first and second electrical transmission means 112, 122 may further comprise bond wires connecting said first and second metal pads 18-1, 18-2 to first and second external connectors of a semiconductor device comprising said semiconductor body 10, wherein said first and second external connectors can be configured to be connected with said first and second signal input 21, 22, respectively, of said sense signal processing unit 2.

According to an embodiment, said electrical parameter of the first metal contact 11 comprises an electrical potential of the first metal contact 11, and said electrical parameter of the second metal contact 12 comprises an electrical potential of the second metal contact 12. For example, said first sense signal 11-1 is a voltage signal corresponding to an electrical potential of the first metal contact 11, and said second sense signal 12-1 may be a voltage signal corresponding to an electrical potential of the second metal contact 12.

According to further embodiment, said electrical parameter of the first metal contact 11 may comprise a current through the first metal contact 11, and said electrical parameter of the second metal contact 12 may comprise a current through the second metal contact 12. For example, said first sense signal 11-1 is a current signal corresponding to a current through the first metal contact 11, and said second sense signal 12-1 is a current signal corresponding to a current through the second metal contact 12.

Said signal processing unit 2 may be part of the semiconductor arrangement 2. For example, the signal processing unit 2 is configured for determining a value of a physical parameter of the semiconductor body 10 in dependence of the first sense signal 11-1 and the second sense signal 12-1, wherein said value may be indicative for at least one of a temperature of the semiconductor body 10 and a load current conducted by the semiconductor body 10.

Figure 2:
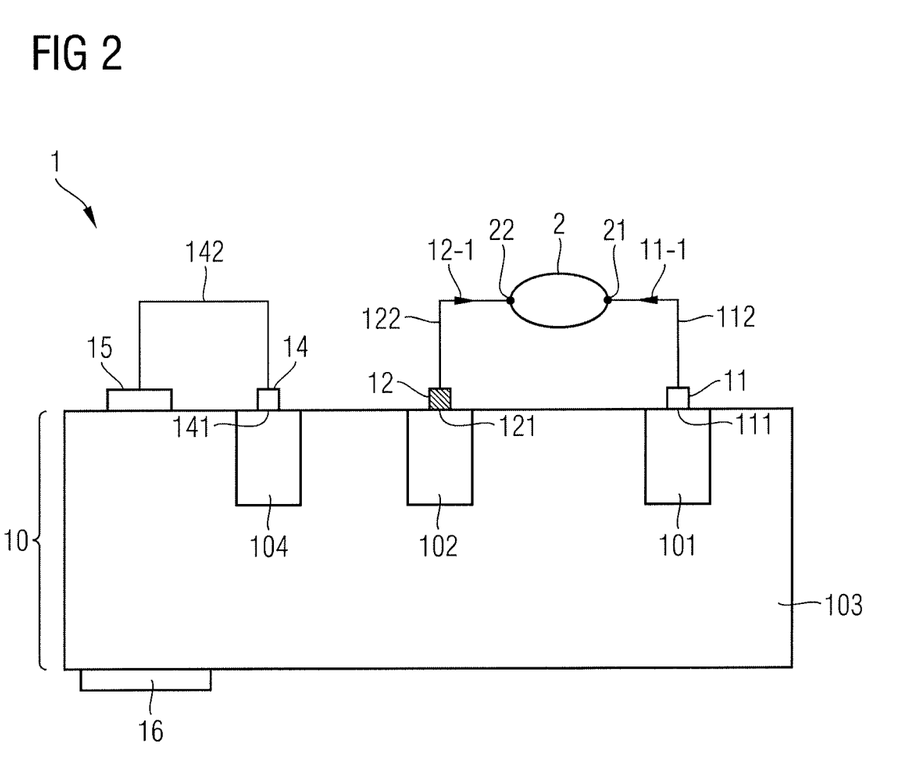
FIG. 2 schematically illustrates a section of a vertical cross-section of a semiconductor arrangement according to one or more embodiments.
Figure 3:
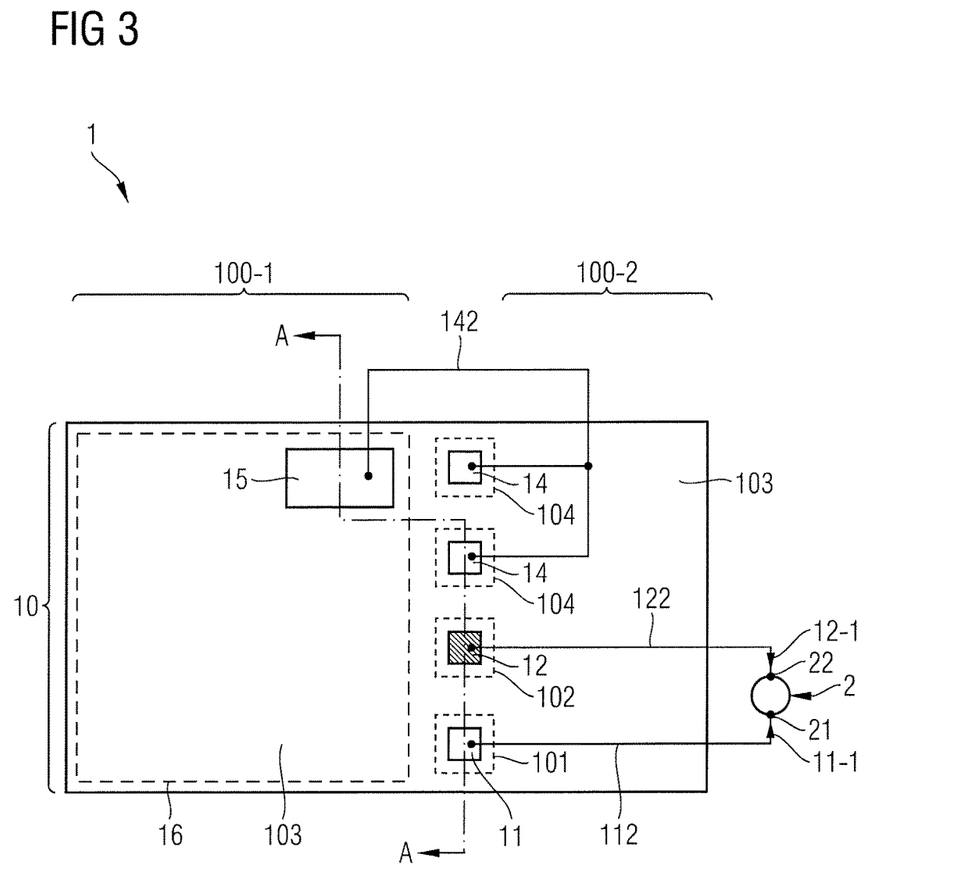
FIG. 3 schematically illustrates a section of a top view of a semiconductor arrangement according to one or more embodiments.

FIG. 2 schematically illustrates a section of a vertical cross-section of a semiconductor arrangement 1 according to one or more embodiments. Some components of the semiconductor arrangement 1 illustrated in FIG. 2 correspond to components of the semiconductor arrangement 1 as illustrated in FIG. 1, e.g. the components illustrated in the right part of FIG. 2). Regarding these components, it is therefore referred to the above description. In the following description, emphasis will be laid upon optional additional features of the embodiment illustrated in FIG. 2 as compared to the embodiment of FIG. 1. Reference will also be made to FIG. 3, which depicts a top view of an embodiment of a semiconductor arrangement 1, wherein FIG. 2 shows a vertical cross-section along the line A-A indicated in FIG. 3.

As explained above, the semiconductor arrangement 1 comprises a semiconductor body 10, which may comprise, e.g., silicon. The semiconductor body 10 includes a semiconductor drift region 103 having dopants of a first conductivity type, which is, for example, n-type in the case of an n⁻-doped semiconductor drift region 103.

For example, at least a part of the semiconductor body 10 can be configured for forming a semiconductor drift region 103 of a semiconductor device such as an IGBT or a MOSFET. Further, at least a part of said semiconductor body 10 can, for instance, be configured for forming a semiconductor drift region 103 of a diode, such as a p-i-n diode.

The semiconductor arrangement 1 further comprises a first load contact 15 and a second load contact 16, wherein each of the first and second load contact 15, 16 is electrically coupled to the semiconductor body 10.

Said semiconductor drift region 103 is arranged for conducting a load current between the first load contact 15 and the second load contact 16 in an active region 100-1 of the semiconductor body 10, see FIG. 3. For example, the active region 100-1 is a region on a semiconductor device chip in which a plurality of active IGBT cells or MOSFET cells are arranged.

In an embodiment, at least a part of said first load contact 15 forms an emitter contact or, respectively, a source contact of said IGBT or said MOSFET. For example, said first load contact 15 comprises an emitter pad 15 on the chip frontside of a vertical IGBT or a source pad 15 on the chip frontside of a vertical power MOSFET, see FIG. 3.

A part of said second load contact 16 can form a collector contact or, respectively, a drain contact of said IGBT or said MOSFET. For instance, said second load contact comprises the backside contact of a vertical IGBT or MOSFET. In the embodiment of FIG. 3, the second contact 16 is supposed to be arranged on the backside, e.g., in the form of a backside metallization, and is therefore indicated with a dashed line in the top view.

As can be seen in FIG. 3, a plurality of semiconductor drain regions 101, 102, 104 may be arranged at least partially internal of the semiconductor body 10 between said active region 100-1 of the semiconductor body 10 and a non-active region 100-2 of the semiconductor body 10. Said semiconductor drain regions 101, 102, 104 are marked with dotted lines in the top view depicted in FIG. 3. For example, the non-active region 100-2 is an edge region of a semiconductor device chip, which is not configured for conducting a load current between the first load contact 15 and the second load contact 16. The non-active region 100-2 may also be a region of the semiconductor body 10 that is covered, for example, by a source pad, an emitter pad, a gate pad 17 (cf. FIG. 4), a gate finger, and/or a gate runner. In such regions, active IGBT or MOSFET cells can be absent, e.g., because there are no emitter or source contacts, respectively.

Each of the semiconductor drain regions 101, 102, 104 is in contact with the semiconductor drift region 103 (see also FIG. 2) and has dopants of a second conductivity type different from said first conductivity type. For example, the semiconductor drain regions 101, 102, 104 are p-doped in the case of an n-doped semiconductor drift region 103.

The plurality of semiconductor drain regions 101, 102, 104 comprises a first semiconductor drain region acting as a first semiconductor sense region 101 and a second semiconductor drain region acting as a second semiconductor sense region 102. Regarding said first and second semiconductor sense regions 101, 102, reference is made to the above description of exemplary embodiments according to FIG. 1, which also pertains to the embodiments of FIG. 2 and FIG. 3.

In accordance with the embodiments illustrated in FIG. 2 and FIG. 3, the plurality of semiconductor drain regions 101, 102, 104 may further comprise at least one third semiconductor drain region 104, which is electrically connected to the first load contact 15 and configured for draining charge carriers from the semiconductor drift region 103. As illustrated in FIG. 3, the plurality of semiconductor drain regions 101, 102, 104 may comprise two third semiconductor drain regions 104. For example, at least one of said third semiconductor drain regions 104 is at least partially formed by a p-well in an n⁻-doped part of the semiconductor drift region 103 and is configured for draining holes from a non-active region 100-2 (e.g. an edge region) of the semiconductor body 10. Thus, said semiconductor drain region 104 may improve a switching behavior of, e.g., an IGBT by draining holes from said non-active region 100-2.

According to an embodiment, the third semiconductor drain regions 104 may be separated from the first semiconductor sense region 101 and from the second semiconductor sense region 102, as depicted in FIG. 2 and FIG. 3. For example, all semiconductor drain regions 101, 102, 104 are at least partially formed by separated p-wells in an n⁻-doped part of the semiconductor drift region 103.

The semiconductor arrangement 1 of FIG. 2 and FIG. 3 may include said first metal contact 11 comprising the first metal material. The first metal contact 11 is separated from the first load contact 15 and the second load contact 16 and in contact with the first semiconductor sense region 101. A transition between the first metal contact 11 and the first semiconductor sense region 101 forms said first metal-to-semiconductor transition 111.

Further, the semiconductor arrangement 1 of FIG. 2 and FIG. 3 may include said second metal contact 12 comprising said second metal material different from said first metal material, the second metal contact 12 being separated from the first load contact 15, the second load contact 16, and the first metal contact 11, and being in contact with second semiconductor sense region 102. A transition between the second metal contact 12 and the second semiconductor sense region 102 forms said second metal-to-semiconductor transition 121 different from said first metal-to-semiconductor transition 111.

Regarding said first and second metal contacts 11, 12, said corresponding metal materials, and first and second metal-to-semiconductor transitions 111, 121, reference is made to the above description of exemplary embodiments according to FIG. 1, which also pertains to the embodiments of FIG. 2 and FIG. 3.

In an embodiment, the semiconductor arrangement 1 of FIG. 2 and FIG. 3 may further comprise said first electrical transmission means 112 that are arranged and configured for providing said first sense signal 11-1 derived from an electrical parameter of the first metal contact 11 to said first signal input 21 of said sense signal processing unit 2. Additionally, the semiconductor arrangement 1 may comprise said second electrical transmission means 122 separated from said first electrical transmission means 112. The second electrical transmission means 122 are arranged and configured for providing said second sense signal 12-1 derived from an electrical parameter of the second metal contact 12 to said second signal input 22 of said sense signal processing unit 2.

Regarding said first and second electrical transmission means 112, 122, corresponding first and second electrical parameters, and first and second sense signals 11-1, 12-1, reference is made to the above description of exemplary embodiments according to FIG. 1, which also pertains to the embodiments of FIG. 2 and FIG. 3.

Figure 4:
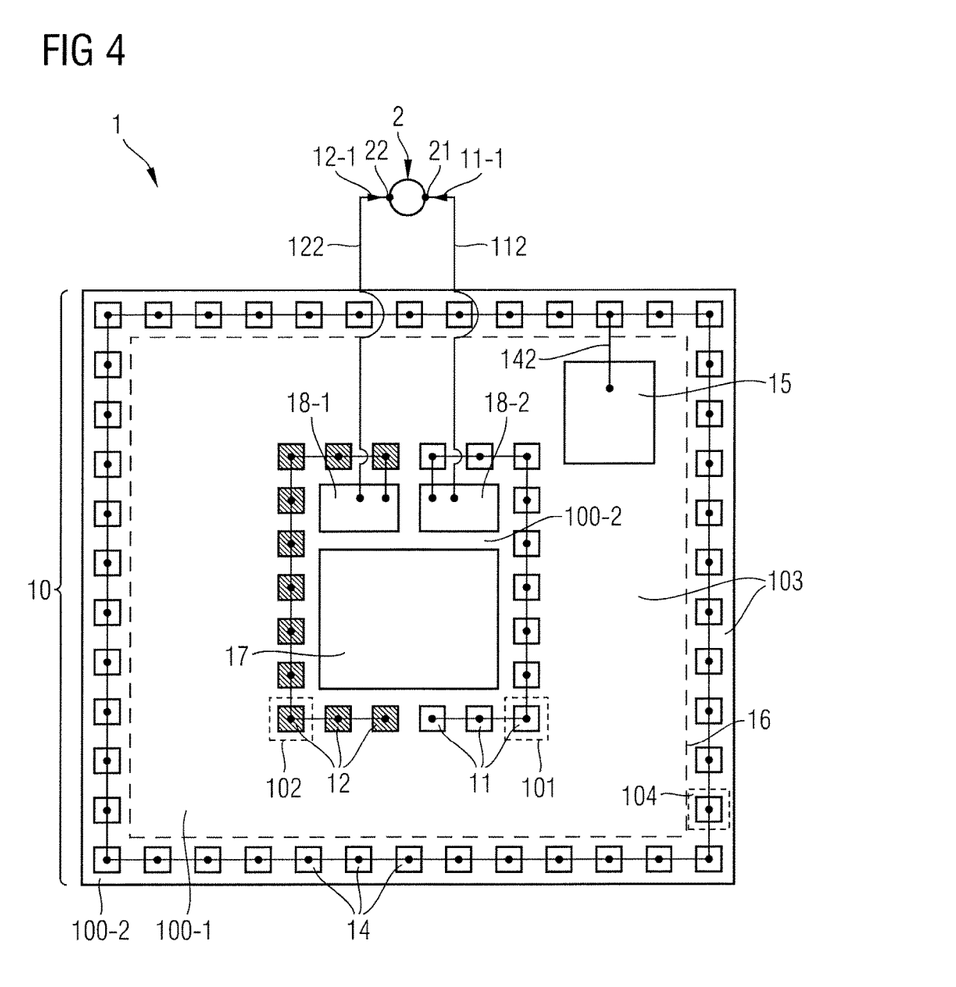
FIG. 4 schematically illustrates a section of a top view of a semiconductor arrangement according to one or more embodiments.

FIG. 4 schematically illustrates a section of a top view of a semiconductor arrangement 1 according to one or more embodiments. The semiconductor body 10 may be part of a semiconductor device chip, which is shown in a top view in FIG. 4. For example, the semiconductor chip is an IGBT or MOSFET chip.

Similar to the embodiment of FIG. 3, the semiconductor body 10 may exhibit an active region 100-1 and non-active regions 100-2, wherein a non-active region 100-2 is located in the vicinity of the edges of the semiconductor device chip, and another non-active region 100-2 is located in the vicinity of a gate pad 17 and adjacent first and second metal pads 18-1, 18-2 close to the center of the semiconductor device chip. In other embodiments, the non-active regions 100-2 may also regions of a semiconductor body 10 that is covered, for example, by a source pad 15, an emitter pad 15, a gate finger, and/or a gate runner. In such regions, active IGBT or MOSFET cells can be absent, e.g., because there are no emitter or source contacts, respectively. The active region 100-1 extends between said non-active regions 100-2 and is configured to conduct a load current between a first load contact 15 and a second load contact 16, wherein the second load contact is a backside contact (indicated with the dashed line), as described above with respect to the embodiments of FIGS. 2 and 3. For example, the active region 100-1 may be surrounded by the non-active region 100-2.

A plurality of first, second and third semiconductor drain regions 101, 102, 104 are arranged at least partially internal of the semiconductor body 10 between said active region 100-1 of the semiconductor body 10 and the non-active region 100-2 of the semiconductor body 10. In the top view depicted in FIG. 4, some of said semiconductor drain regions 101, 102, 104 are marked exemplarily with dotted lines.

Regarding optional features of said first, second and third semiconductor drain regions 101, 102, 104 and said corresponding metal contacts 11, 12, 14, as well as of the signal processing unit 2 connected with said first and second metal contacts 11, 12, reference is made to the above description of exemplary embodiments according to FIGS. 2-3, which also pertains to the embodiment of FIG. 4.

In accordance with the embodiment illustrated in FIG. 4, the third semiconductor drain regions 104, which may be configured to drain charge carriers from the semiconductor drift region 103 in the vicinity of the edges of the semiconductor device chip, are electrically connected to an emitter pad or a source pad, which may form the first load contact 15. The first semiconductor sense regions 101 can be electrically connected to a first metal pad 18-1, and the first sense regions 102 can be electrically connected to a second metal pad 18-2. Said first and second metal pads 18-1, 18-2 may be contacted by bond wires. They may form a part of said first and second electrical transmission means 112, 122 to said first and second signal inputs 21, 22 of said signal processing unit 2.

The first semiconductor drain region 101 may act as said first semiconductor sense region, and the second semiconductor drain region 102 may act as said second semiconductor sense region 102, as elaborated above in connection with the embodiments of FIGS. 2 and 3. Said first semiconductor sense region 101 and the second semiconductor sense regions 102, together with the respective first and second metal contacts 11, 12, may be arranged symmetrically about the center of the semiconductor device chip. Thus, in operation of a semiconductor device comprising the semiconductor body 10, it can be ensured that a current density prevailing at the first semiconductor sense region 101 is equal or similar to a current density prevailing at the second semiconductor sense region 102.

Figure 5:
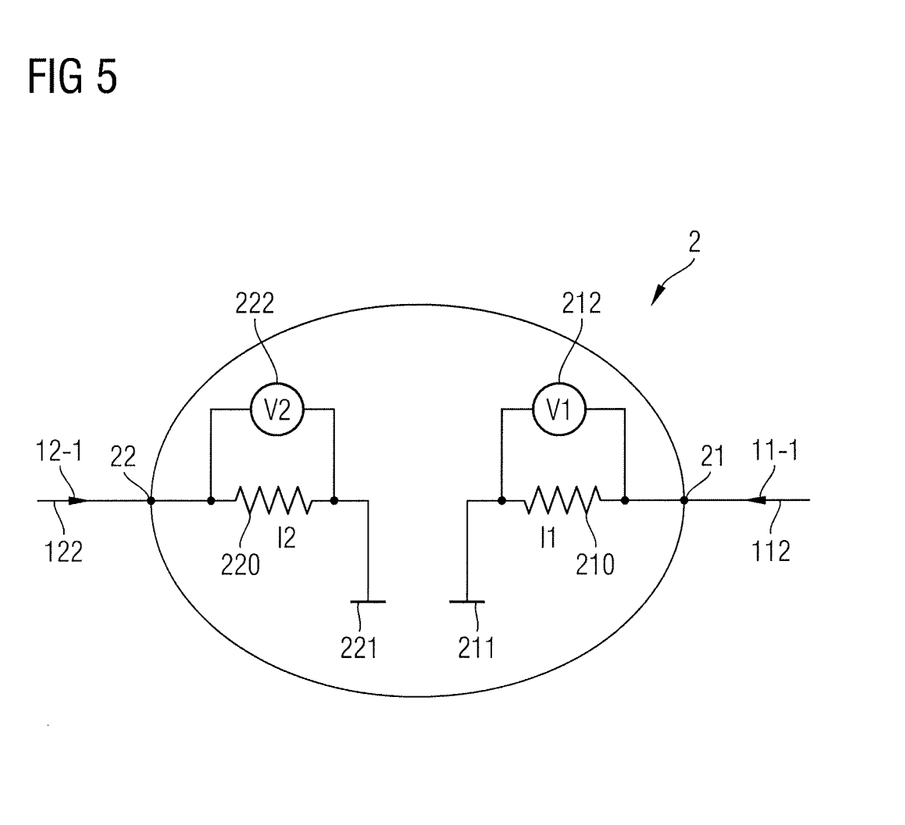
FIG. 5 schematically illustrates components of a sense signal processing unit according to one or more embodiments.

FIG. 5 schematically illustrates a sense signal processing unit 2 according to one or more embodiments, e.g., embodiments as described above with respect to FIGS. 1-4. The sense signal processing unit 2 may be part of the semiconductor arrangement 1. In addition to said first and second signal inputs 21, 22 for said first and second sense signals 11-1, 12-1, the signal processing unit 2 may comprise a first shunt 210 and a first output terminal 211. The first shunt 210 can be arranged for conducting a first current I1 between the first signal input 21 and the first output terminal 211. The signal processing unit 2 may further comprise a second shunt 220 and a second output terminal 221, wherein the second shunt 220 can be arranged for conducting a second current I2 between the second signal input 22 and the second output terminal 221.

For example, the first shunt 210 and/or the second shunt 220 comprise(s) a metallic resistor and/or a polysilicon resistor. In an embodiment, each of the first shunt 210 and the second shunt 220 exhibit the same resistance value.

Said first output terminal 211 and said second output terminal 221 can be electrically connected to each other. For example, each of the first output terminal 211 and the second output terminal 221 can be electrically connected to ground, and the first and second output terminals 211, 221 can be electrically connected to each other via the ground. In an embodiment, the first output terminal 211 and the second output terminal 221 are electrically connected to each other and to a load contact 15 of the semiconductor arrangement 1. For example, the first and second output terminals 211, 221 are electrically connected to the first load contact 15 of a semiconductor arrangement according to FIG. 2 or FIG. 3, wherein the first load contact may be an emitter contact of an IGBT or a source contact of a MOSFET.

According to an embodiment, the sense signal processing unit 2 comprises first voltage measurement means 212 configured for determining a first voltage drop V1 at the first shunt 210 and second voltage measurement means 222 configured for determining a second voltage drop V2 at the second shunt 220. For example, said first voltage measurement means 212 and/or said second voltage measurement means 222 comprise a voltmeter that is electrically connected in parallel to said first and second shunt 210, 220, respectively. Thus, the voltage drop V1 at the first shunt 210 measured with the first voltage measurement means 212 may be indicative of the first current I1, and the voltage drop V2 at the second shunt 220 measured with the second voltage measurement means 222 may be indicative of the second current I2.

As elaborated above, the semiconductor arrangement 1 may comprise said sense signal processing unit 2. For example, the sense signal processing unit 2 is integrated on a semiconductor device chip comprising said semiconductor body 10. Alternatively, the sense signal processing unit 2 may be arranged on a separate semiconductor chip and is coupled to the semiconductor arrangement 1, e.g., by means of the electrical transmission means 112, 122. For example, for processing said first sense signal 11-1 and said second sense signal 12-1, the sense signal processing unit 2 may comprise at least one of an ASIC, a microcontroller, a FPGA.

Said sense signal processing unit 2 can also be arranged external of a semiconductor device comprising said semiconductor body 10. For example, the sense signal processing unit 2 can be arranged external of a discrete IGBT, wherein said first and second electrical transmission means 112, 122 may comprise external lead contacts of said discrete IGBT, which can be electrically connected to said first and second signal inputs 21, 22. Further, the sense signal processing unit 2 can be at least partially arranged inside a power module, e.g., a molded power module that includes a semiconductor device comprising said semiconductor body 10. For example, the sense signal processing unit 2 is arranged on a PCB together with an IGBT chip comprising said semiconductor body 10, wherein said first and second electrical transmission means 112, 122 comprise bond wires attached to bond pads.

The sense signal processing unit 2 can be configured for determining a value of a physical parameter of the semiconductor body 10 in dependence of the first sense signal 11-1 and the second sense signal 12-1. For example, said value is indicative for a temperature of the semiconductor body 10. Alternatively, said value can be indicative for a load current conducted by the semiconductor body 10. For example, the sense signal processing unit 2 can comprise at least one of an ASIC, a microcontroller, a FPGA configured to determine a temperature of the semiconductor body 10 in dependence of a difference of said first current I1 and said second current I2. Such a current difference may arise due to a difference in the work functions of the first and second metal materials, which may translate into a difference in the temperature dependence of a resistance of the first and second metal-to-semiconductor transitions 111, 121.

The sense signal processing unit 2 can comprise a memory unit (not shown) configured to store data for translating a difference of the first and second currents I1, I2 to a temperature value of the semiconductor body 10. Further, the sense signal processing unit 2 can be configured to take into account a value that is indicative for a load current conducted by the semiconductor body 10 when translating said difference of the first and second currents I1, I2 to a temperature value of the semiconductor body 10.

In addition, said sense signal processing unit 2 may comprise a signal output configured for providing a signal that is indicative for the determined physical parameter of the semiconductor body 10 to at least one of a display or a controller unit. For example, the display is a monitor that indicates a temperature of the semiconductor body 10. The controller unit can be a computer or a microcontroller configured for controlling a semiconductor device comprising said semiconductor body 10 in dependence of the determined value of the physical parameter.

In the following, a method for determining a physical parameter of a semiconductor device is presented. For example, the semiconductor device is a power semiconductor device such as an IGBT, a MOSFET or a diode. The semiconductor device comprises a semiconductor body 10 including a semiconductor drift region 103 having dopants of a first conductivity type, as elaborated above with reference to the embodiments of a semiconductor arrangement 1 depicted in FIGS. 1-3. Further, the semiconductor device comprises a first semiconductor sense region 101 and a second semiconductor sense region 102, wherein each of the first semiconductor sense region 101 and the second semiconductor sense region 102 is electrically connected to the semiconductor drift region 103 and has dopants of a second conductivity type different from said first conductivity type. A first metal contact 11 comprising a first metal material is in contact with the first semiconductor sense region 101, wherein a transition between the first metal contact 11 and the first semiconductor sense region 101 forms a first metal-to-semiconductor transition 111. In addition, a second metal contact 12 comprising a second metal material different from said first metal material is separated from the first metal contact 11 and is in contact with the second semiconductor sense region 102, a transition between the second metal contact 12 and the second semiconductor sense region 102 forming a second metal-to-semiconductor transition 121 different from said first metal-to-semiconductor transition 111.

Regarding said semiconductor body 10 of the semiconductor device, said semiconductor drift region 103, said first and second metal contacts 11, 12, said different metal materials, and said first and second metal-to-semiconductor transitions 111, 121, reference is made to the above description of exemplary embodiments of a semiconductor arrangement 1 according to FIG. 1, which also pertains to said semiconductor device.

The method for determining a physical parameter of said semiconductor device comprises deriving a first sense signal 11-1 from an electrical parameter of the first metal contact 11. Said electrical parameter of the first metal contact 11 comprises at least one of an electrical potential of the first metal contact 11 and a current through the first metal contact 11. Further, the method comprises deriving a second sense signal 12-1 from an electrical parameter of the second metal contact 12, wherein the electrical parameter of the second metal contact 12 comprises at least one of an electrical potential of the second metal contact 12 and a current through the second metal contact 12. For example, a first current signal 11-1 is derived from a first current I1 through the first metal contact 11, and a second current signal 12-1 is derived from a second current I2 through the second metal contact 12.

As a further step, the method comprises determining a value of said physical parameter of the semiconductor device in dependence of the first sense signal 11-1 and the second sense signal 12-1, said value being indicative for at least one of a temperature of the semiconductor body 10 and a load current conducted by the semiconductor body 10.

According to an embodiment, determining the value of the physical parameter comprises determining a first current I1 through the first metal contact 11 based on the first sense signal 11-1 and determining a second current I2 through the second metal contact 12 based on the second sense signal 12-1.

For instance, a temperature value of the semiconductor body 10 of an IGBT is determined in dependence of a first current signal 11-1 derived from a first current I1 through the first metal contact 11 and of a second current signal 12-1 derived from a second current I2 through the second metal contact 12. To this end, the first and second metal contacts 11, 12 can be electrically connected to a signal processing unit 2 as described above with reference to FIG. 5 in manner as described with reference to embodiments of a semiconductor arrangement 1 according to FIGS. 1-3. For example, the first current I1 is deduced from a first voltage drop V1 at said first shunt 210 of the signal processing unit 2, and the second current I2 is deduced from a second voltage drop V1 at said second shunt 220.

The value of the physical parameter can be determined in dependence of a difference of the first current I1 and the second current I2. For example, a difference I1−I2 of the first and second currents, which may be caused by a difference in the temperature dependences of the first and second metal-to-semiconductor transitions 111, 121, is translated to a temperature value of the semiconductor body 10. Translating said difference I1−I2 of the first and second currents to a temperature value of the semiconductor body 10 can include accessing data stored in a memory unit of said signal processing unit 2, wherein the stored data comprise temperature values attributed to corresponding current differences I1−I2.

Translating said difference I1−I2 of the first and second currents to a temperature value of the semiconductor body 10 can include to taking into account a value that is indicative for a load current conducted by the semiconductor body 10. Translating said difference I1−I2 of the first and second currents to a temperature value of the semiconductor body 10 can further include calibrating said data stored in a memory unit of said signal processing unit 2 in dependence of a load current conducted by the semiconductor body 10.

The method for determining a physical parameter of said semiconductor device can further comprise controlling the semiconductor device in dependence of the determined value of the physical parameter. For example, a signal that is indicative for the determined physical parameter of the semiconductor body 10 may be provided by a signal output of said signal processing unit 2 to at least one of a display or a controller unit. For example, the display is a computer or a microcontroller configured for controlling a semiconductor device comprising said semiconductor body 10 in dependence of the determined value of the physical parameter. In this manner, protections against, e.g., short circuits or overheating of the semiconductor device may be implemented.

The embodiments described above include the recognition that measuring a temperature of power semiconductor devices in operation is increasingly important in applications. In particular, sensing the temperature of an IGBT in operation is required for protective functions or an optimized control.

Usually, temperature sensing is achieved via a dedicated circuitry at the periphery of an IGBT chip. For example, an active measurement current is driven through a diode region at the periphery of an IGBT chip, and a temperature is deduced from a forward voltage drop at the diode. However, the temperature measured in such a manner is generally lower than the relevant maximal temperature, which prevail generally in the center of an active IGBT chip area.

Measuring this maximal temperature could require arranging the temperature sensing circuitry inside the active area, which is general difficult to realize with a dedicated circuitry relying on an active measurement current.

In accordance with one or more embodiments, it is proposed to use at least two of a plurality of semiconductor drain regions as a first semiconductor sense region and a second semiconductor sense region, respectively. In many power semiconductor devices, such a plurality of semiconductor drain regions is arranged between an active (i.e., nominally current-carrying) region and a non-active (i.e., nominally current-free) region of a semiconductor body, wherein each of the plurality of semiconductor drain regions is in contact with a semiconductor drift region having dopants of a first conductivity type, and has dopants of a second conductivity type different from said first conductivity type. For example, p-doped semiconductor drain regions may be arranged and configured to drain holes from an edge region of an IGBT, thereby optimizing the switching behavior.

A first and a second metal contact form a first and a second metal-to-semiconductor transition with said first and second semiconductor sense region, respectively. The second metal contact comprises a metal material that is different from a metal material of the first metal contact. For example, said first and second metal materials have different work functions. Thus, a resistance of the first metal-to-semiconductor transition can have a temperature dependence that is different from a temperature dependence of a resistance of the second metal-to-semiconductor transition.

In accordance with one or more embodiments, it is further proposed to provide first and second electrical transmission means that are arranged and configured for providing a first sense signal and a second sense signal derived from an electrical parameter of the first metal contact and the second metal contact, respectively, to a sense signal processing unit. For example, first and second currents through the first and second metal contacts can be compared by the sense signal processing unit. Due to the different temperature dependences of the first and second metal-to-semiconductor transitions, a temperature of the semiconductor body at the location of said semiconductor sense regions may be deduced from the difference of said first and second currents.

According to an embodiment, the method for determining a physical parameter of a semiconductor device relies solely on a passive measurement current that contributes to a load current of the semiconductor device. The semiconductor sense regions can be located close to the center of a semiconductor chip comprising said semiconductor body, wherein said first and second electrical transmission means each can comprise parts of a structured metallization layer arranged on a surface of the semiconductor body. Thus, with the proposed semiconductor arrangement and method, the relevant maximal temperature close to the center of the chip can be accessed for measurement.

Features of further embodiments are defined in the dependent claims. The features of further embodiments and the features of the embodiments described above may be combined with each other for forming additional embodiments, as long as said features are not explicitly described as being alternative to each other.

In the above, embodiments pertaining to semiconductor arrangements, embodiments pertaining to circuit arrangements and embodiments pertaining to a method for determining a physical parameter of a semiconductor device were explained. For example, these semiconductor arrangements and semiconductor devices are based on silicon (Si). Accordingly, a monocrystalline semiconductor region or layer, e.g., the semiconductor body 10 and the semiconductor regions 101 to 104 of exemplary embodiments, are typically a monocrystalline Si-region or Si-layer. In other embodiments, polycrystalline or amorphous silicon may be employed.

It should, however, be understood that the semiconductor body 10 and the semiconductor regions 101 to 104 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGainN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor devices applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor arrangement, comprising:
   a semiconductor body, the semiconductor body including a semiconductor drift region, wherein the semiconductor drift region has dopants of a first conductivity type;
   a first semiconductor sense region and a second semiconductor sense region, wherein each of the first semiconductor sense region and the second semiconductor sense region is electrically connected to the semiconductor drift region and has dopants of a second conductivity type different from said first conductivity type;
   a first metal contact comprising a first metal material, the first metal contact being in contact with the first semiconductor sense region, wherein a transition between the first metal contact and the first semiconductor sense region forms a first metal-to-semiconductor transition;
   a second metal contact comprising a second metal material different from said first metal material, the second metal contact being separated from the first metal contact and in contact with the second semiconductor sense region, a transition between the second metal contact and the second semiconductor sense region forming a second metal-to-semiconductor transition different from said first metal-to-semiconductor transition;
   first electrical transmission means, the first electrical transmission means being arranged and configured for providing a first sense signal derived from an electrical parameter of the first metal contact to a first signal input of a sense signal processing unit;
   second electrical transmission means separated from said first electrical transmission means, the second electrical transmission means being arranged and configured for providing a second sense signal derived from an electrical parameter of the second metal contact to a second signal input of said sense signal processing unit.

2. The semiconductor arrangement of claim 1, wherein each of the first semiconductor sense region and the second semiconductor sense region is arranged at least partially internal of the semiconductor body and is in contact with the semiconductor drift region.

3. A semiconductor arrangement, comprising:
a semiconductor body, the semiconductor body including a semiconductor drift region, wherein the semiconductor drift region has dopants of a first conductivity type;
a first load contact electrically coupled to the semiconductor body and a second load contact electrically coupled to the semiconductor body, the semiconductor drift region being arranged for conducting a load current between the first load contact and the second load contact in an active region of the semiconductor body;
a plurality of semiconductor drain regions arranged at least partially internal of the semiconductor body between said active region of the semiconductor body and a non-active region of the semiconductor body, wherein each of the plurality of semiconductor drain regions is in contact with the semiconductor drift region and has dopants of a second conductivity type different from said first conductivity type, and wherein the plurality of semiconductor drain regions comprises a first semiconductor drain region acting as a first semiconductor sense region, a second semiconductor drain region acting as a second semiconductor sense region, and at least one third semiconductor drain region, the at least one third semiconductor drain region being electrically connected to the first load contact and being configured for draining charge carriers from the semiconductor drift region;
a first metal contact comprising a first metal material, the first metal contact being separated from the first load contact and the second load contact and in contact with the first semiconductor sense region, wherein a transition between the first metal contact and the first semiconductor sense region forms a first metal-to-semiconductor transition;
a second metal contact comprising a second metal material different from said first metal material, the second metal contact being separated from the first load contact, the second load contact, and the first metal contact, and being in contact with second semiconductor sense region, a transition between the second metal contact and the second semiconductor sense region forming a second metal-to-semiconductor transition different from said first metal-to-semiconductor transition.

4. The semiconductor arrangement of claim 3, further comprising:
first electrical transmission means, the first electrical transmission means being arranged and configured for providing a first sense signal derived from an electrical parameter of the first metal contact to a first signal input of a sense signal processing unit;
second electrical transmission means separated from said first electrical transmission means, the second electrical transmission means being arranged and configured for providing a second sense signal derived from an electrical parameter of the second metal contact to a second signal input of said sense signal processing unit.

5. The semiconductor arrangement of claim 3, wherein
at least a part of the semiconductor body is configured for forming a semiconductor drift region of one of an IGBT and a MOSFET;
at least a part of said first load contact is configured for forming an emitter contact or, respectively, a source contact of said IGBT or said MOSFET;
at least a part of said second load contact is configured for forming a collector contact or, respectively, a drain contact of said IGBT or said MOSFET.

6. The semiconductor arrangement of claim 3, wherein the third semiconductor drain region is separated from the first semiconductor sense region and from the second semiconductor sense region.

7. The semiconductor arrangement of claim 1, wherein a resistance of the first metal-to-semiconductor transition has a temperature dependency that is different from a temperature dependency of a resistance of the second metal-to-semiconductor transition.

8. The semiconductor arrangement of claim 3, wherein a resistance of the first metal-to-semiconductor transition has a temperature dependency that is different from a temperature dependency of a resistance of the second metal-to-semiconductor transition.

9. The semiconductor arrangement of claim 1, wherein the sense signal processing unit comprises:
a first shunt and a first output terminal, wherein the first shunt is arranged for conducting a first current between the first signal input and the first output terminal;
a second shunt and a second output terminal, wherein the second shunt is arranged for conducting a second current between the second signal input and the second output terminal.

10. The semiconductor arrangement of claim 4, wherein the sense signal processing unit comprises:
a first shunt and a first output terminal, wherein the first shunt is arranged for conducting a first current between the first signal input and the first output terminal;
a second shunt and a second output terminal, wherein the second shunt is arranged for conducting a second current between the second signal input and the second output terminal.

11. The semiconductor arrangement of claim 9, wherein the first output terminal and the second output terminal are electrically connected to each other and to a load contact of the semiconductor arrangement.

12. The semiconductor arrangement of claim 10, wherein the first output terminal and the second output terminal are electrically connected to each other and to a load contact of the semiconductor arrangement.

13. The semiconductor arrangement of claim 9, wherein the sense signal processing unit comprises first voltage measurement means configured for determining a first voltage drop (V1) across the first shunt and second voltage measurement means configured for determining a second voltage drop (V2) across the second shunt.

14. The semiconductor arrangement of claim 10, wherein the sense signal processing unit comprises first voltage measurement means configured for determining a first voltage drop (V1) across the first shunt and second voltage measurement means configured for determining a second voltage drop (V2) across the second shunt.

15. The semiconductor arrangement of claim 1, wherein the semiconductor arrangement comprises said sense signal processing unit, and wherein the sense signal processing unit is configured for determining a value of a physical parameter of the semiconductor body in dependence of the first sense signal and the second sense signal, wherein said value is indicative for at least one of a temperature of the semiconductor body and a load current conducted by the semiconductor body.

16. The semiconductor arrangement of claim 4, wherein the semiconductor arrangement comprises said sense signal processing unit, and wherein the sense signal processing unit is configured for determining a value of a physical parameter of the semiconductor body in dependence of the first sense signal and the second sense signal, wherein said value is indicative for at least one of a temperature of the semiconductor body and a load current conducted by the semiconductor body.

17. A method for determining a physical parameter of a semiconductor device, wherein the semiconductor device comprises: a semiconductor body, the semiconductor body including a semiconductor drift region, wherein the semiconductor drift region has dopants of a first conductivity type; a first semiconductor sense region and a second semiconductor sense region, wherein each of the first semiconductor sense region and the second semiconductor sense region is electrically connected to the semiconductor drift region and has dopants of a second conductivity type different from said first conductivity type; a first metal contact comprising a first metal material, the first metal contact being in contact with the first semiconductor sense region, wherein a transition between the first metal contact and the first semiconductor sense region forms a first metal-to-semiconductor transition; a second metal contact comprising a second metal material different from said first metal material, the second metal contact being separated from the first metal contact and in contact with the second semiconductor sense region, a transition between the second metal contact and the second semiconductor sense region forming a second metal-to-semiconductor transition different from said first metal-to-semiconductor transition; wherein the method comprises:
  deriving a first sense signal from an electrical parameter of the first metal contact, wherein the electrical parameter of the first metal contact comprises at least one of an electrical potential of the first metal contact and a current through the first metal contact;
  deriving a second sense signal from an electrical parameter of the second metal contact, wherein the electrical parameter of the second metal contact comprises at least one of an electrical potential of the second metal contact and a current through the second metal contact;
  determining a value of said physical parameter of the semiconductor device in dependence of the first sense signal and the second sense signal, said value being indicative for at least one of a temperature of the semiconductor body and a load current conducted by the semiconductor body.

18. The method of claim 16, wherein determining the value of the physical parameter comprises determining a first current through the first metal contact based on the first sense signal and determining a second current through the second metal contact based on the second sense signal.

19. The method of claim 17, wherein the value of the physical parameter is determined in dependence of a difference of the first current and the second current.

20. The method of claim 16, further comprising controlling the semiconductor device in dependence of the determined value of the physical parameter.

* * * * *